United States Patent [19]
Burke et al.

[11] Patent Number: 6,091,309
[45] Date of Patent: Jul. 18, 2000

[54] TUNABLE LOW NOISE OSCILLATOR USING DELAY LINES AND RING MODE TRAP FILTER

[76] Inventors: Joseph P. Burke, 2411 La Plancha La.; Peter D. Heidmann, 2611 Jacaranda Ave., both of Carlsbad, Calif. 92009

[21] Appl. No.: 09/013,355

[22] Filed: Jan. 26, 1998

[51] Int. Cl.[7] .............................. H03B 1/04; H03B 5/12; H03B 5/18
[52] U.S. Cl. .................... 331/117 R; 331/96; 331/105; 331/117 D; 331/175; 331/36 C; 331/177 V; 331/117 FE
[58] Field of Search ............................... 331/36 C, 96, 331/99–102, 105, 117 R, 117 FE, 117 D, 175, 177 V

[56] References Cited

U.S. PATENT DOCUMENTS

| | | | |
|---|---|---|---|
| 2,451,910 | 10/1948 | Bock | 250/27 |
| 4,504,801 | 3/1985 | Stut | 331/117 D |
| 4,616,193 | 10/1986 | Meyer | 331/105 |
| 4,891,610 | 1/1990 | Veith | 331/96 |
| 5,834,981 | 11/1998 | Trier et al. | 331/99 |

*Primary Examiner*—David Mis
*Attorney, Agent, or Firm*—Russell B. Miller; Christopher O. Edwards

[57] ABSTRACT

An oscillator comprises an active device with a phase shift of less than 180 degrees. A first delay line has first and second ends. The first end of the first delay line is coupled to an active port of the active device. A ring mode trap filter is coupled to the second end of the first delay line. A second delay line has first and second ends. The first end of the second delay line is coupled to the ring mode trap filter. The second end of the second delay line is coupled to a resonance means. The total delay of the first and second delay lines allows the resonance means to oscillate at its natural frequency in spite of the less-than-180-degree phase shift of the active device.

23 Claims, 9 Drawing Sheets

TUNABLE LOW NOISE OSCILLATOR USING DELAY LINES AND RING MODE TRAP FILTER

BACKGROUND OF THE INVENTION

I. Field of the Invention

The present invention relates to radio frequency signal generation and more particularly relates to oscillator circuits.

II. Description of the Related Art

Radio frequency (RF) signal generation entails deriving alternating current (AC) from direct current (DC) energy. One typical RF signal generator is an oscillator. An oscillator is typically comprised of an active device that is biased with DC energy and loaded to provide positive feedback to the active device. The active device may be, by way of example, a bipolar transistor (BJT), a field effect transistor (FET) or metal semiconductor field effect transistor (MESFET) or other device.

Figure 1:
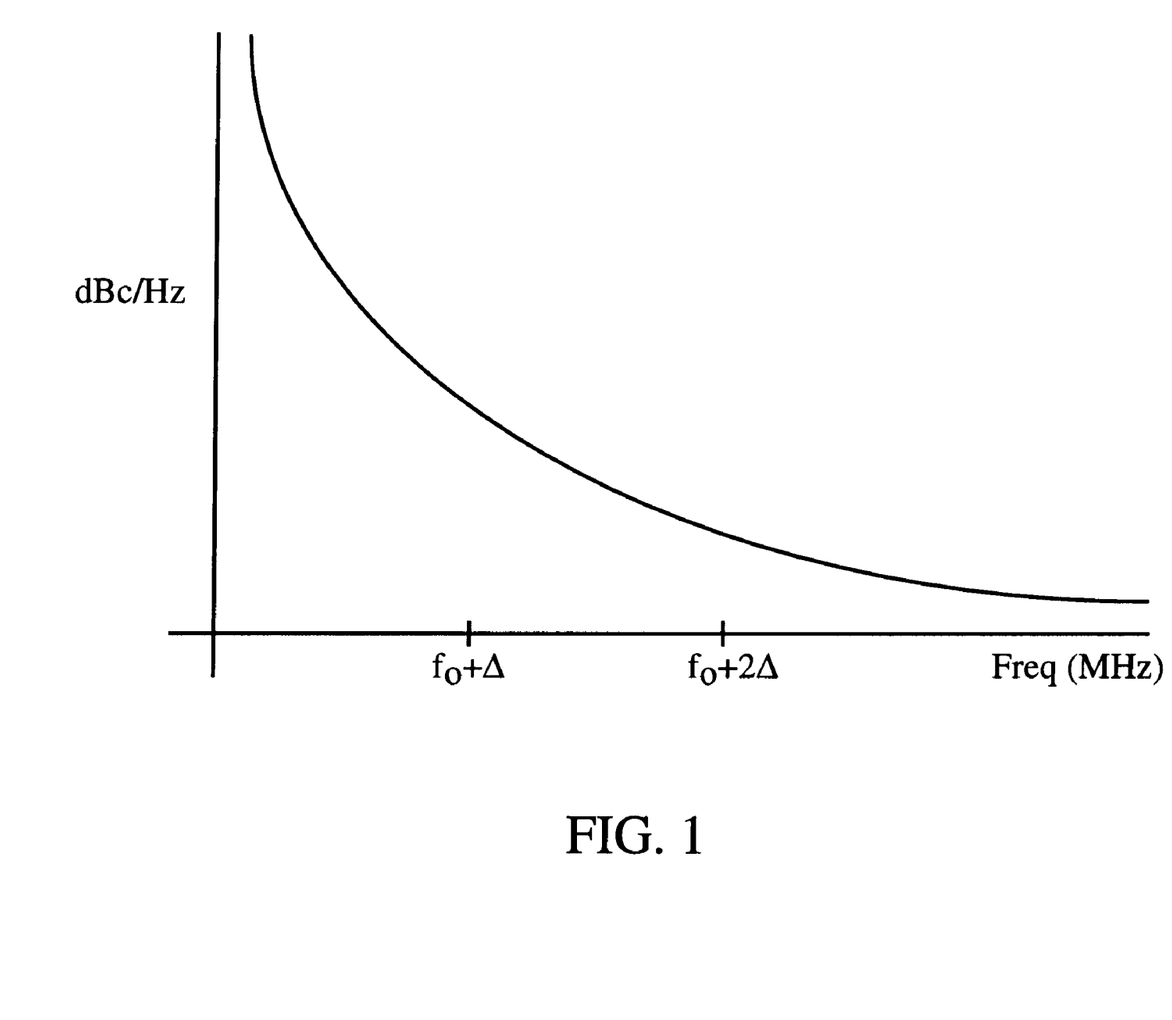
FIG. 1 is a graphical representation of the one sided spectral density of phase fluctuations, $S_\phi(f)$, of a resultant AC signal produced by an oscillator.

A critical factor in the performance of an oscillator is the phase noise of the resultant AC signal. Phase noise is created by frequency and phase jitter in the resultant AC signal. Phase noise may be observed in the resultant AC signal by examination of its spectrum in the frequency domain. Phase noise is typically measured in terms of a one sided spectral density of phase fluctuations, $S_\phi(f)$ of the desired AC signal at some frequency offset from the desired AC signal. For example, an exemplary phase noise requirement for an oscillator producing a frequency of 1.8 GigaHertz (GHz) is −110 dBc/Hz at 10 KHz, −130 dBc/Hz at 100 KHz, and −150 dBc/Hz at 1 MHz. The phase noise which is offset from the desired AC signal by a small amount (typically less than 10 KHz), is referred to as the close-in phase noise. The phase noise which is offset from the desired AC signal by a larger amount (typically greater than 10 kHz) is referred to as the far-out phase noise. FIG. 1 shows a typical spectrum of an AC signal generated by an oscillator operating at frequency fo. The phase noise at fo+Δ represents the close-in phase noise while the phase noise at point fo+2Δ represents the far-out phase noise.

Figure 2:
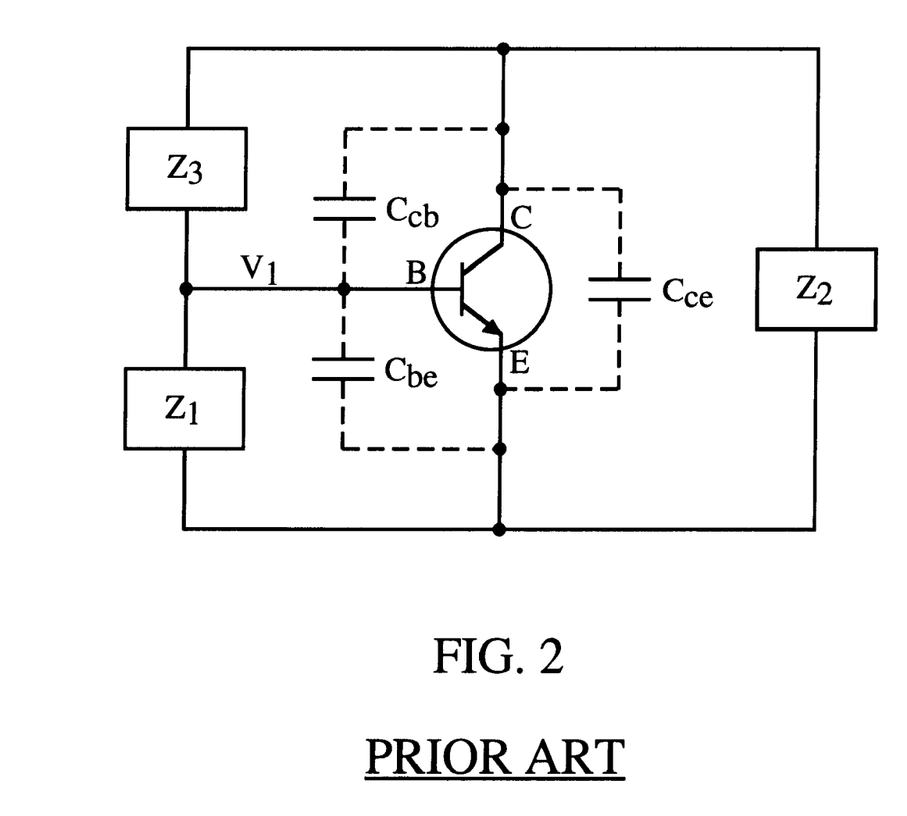
FIG. 2 is a block diagram showing the basic configuration of an oscillator comprising a bipolar transistor.

Phase noise is created from a number of sources. One major contribution to phase noise that can be minimized by a thoughtful design is the bias dependent junction capacitance inherent in active devices. FIG. 2 is a block diagram showing the basic configuration of an oscillator comprising a bipolar transistor. In FIG. 2, Z1, Z2, and Z3 represent the equivalent impedances coupled to the active device. Z1, Z2, and Z3 may be created using lumped, distributed or active components. In FIG. 2, the junction capacitance is shown as three discrete capacitors, Ccb, Cce, and Cbe. The junction capacitance is inherent in the device. Depending on the topology of the oscillator design, either Z1, Z2, or Z3 may comprise the resonant tank which should be the major determining factor of the frequency of the resultant AC signal. Note that no matter which option is taken, one of the stray junction capacitors is in parallel with the resonant tank and affects the resultant resonant tank center frequency. Therefore, the stray junction capacitance influences the frequency of the resultant AC signal. If the value of the stray capacitance changes, the frequency of the resultant AC signal also changes. Small time dependent changes in junction capacitance result in changes in frequency that will create phase noise on the resultant AC signal.

The value of the stray capacitance is determined by a number of factors. The inherent characteristics of the device determine a steady state value of capacitance. In addition, the value of the inherent stray capacitance is a function of the temperature and DC bias point of the device. Thus, if the temperature of the device changes, the value of the stray capacitance changes. If the bias point changes, such as due to noise in the DC power supply, the value of the stray capacitance also changes. As noted above, if the value of the stray capacitance changes, the resultant AC signal also changes. The change creates phase noise in the resultant AC signal.

When designing a low noise oscillator, the effect of stray capacitance may be reduced by several means. Because the value of the stray capacitance is dependent on the bias point selected for steady state DC operation, the bias point should be chosen to be a point at which the variations and absolute value of the stray capacitance is relatively small. Also, the effect of the stray capacitance is dependent on the selection of a topology. Referring again to FIG. 2, typically the value of Cbe is larger than the value of Cce. Therefore, a common base configuration in which Z2 is the tank oscillator may be preferred. If we think in terms of lumped elements, Z2 may be modeled in terms of a parallel inductor/capacitor (LC) tank. With this model, Cce becomes a second parallel capacitor across the tank. In order to reduce the effect of Cce, the tank capacitor may be chosen relatively large in comparison with the Cce. However, at high frequencies, large capacitance values require very small values of inductance to produce the desired tank center frequency. For example, for a parallel inductor/capacitor tank, the tank resonant frequency is defined by:

$$w_o = \frac{1}{\sqrt{LC}}$$

where: $\omega_0$ is the tank resonant frequency;
C is the value of the tank capacitor: and
L is the value of the tank inductor.

As the value of C is increased, the value of L must decrease in order to maintain the same resonant frequency. Thus, the value of C may not be increased without bound and must be limited with consideration for the realizable values of L. Also, in reality, large capacitors do not exhibit good capacitance qualities at high frequencies.

Phase noise may be reduced by the careful selection of an active device. For example, BJTs typically have better flicker noise (i.e. 1/f noise) characteristics than FET devices. However, certain BJT devices have lower operating frequencies than other devices such as GaAs FETs, and, therefore, may not be viable alternatives at very high frequencies. Also, bipolar devices are cheaper, more readily available and more likely to be available from multiple sources.

Figure 3:
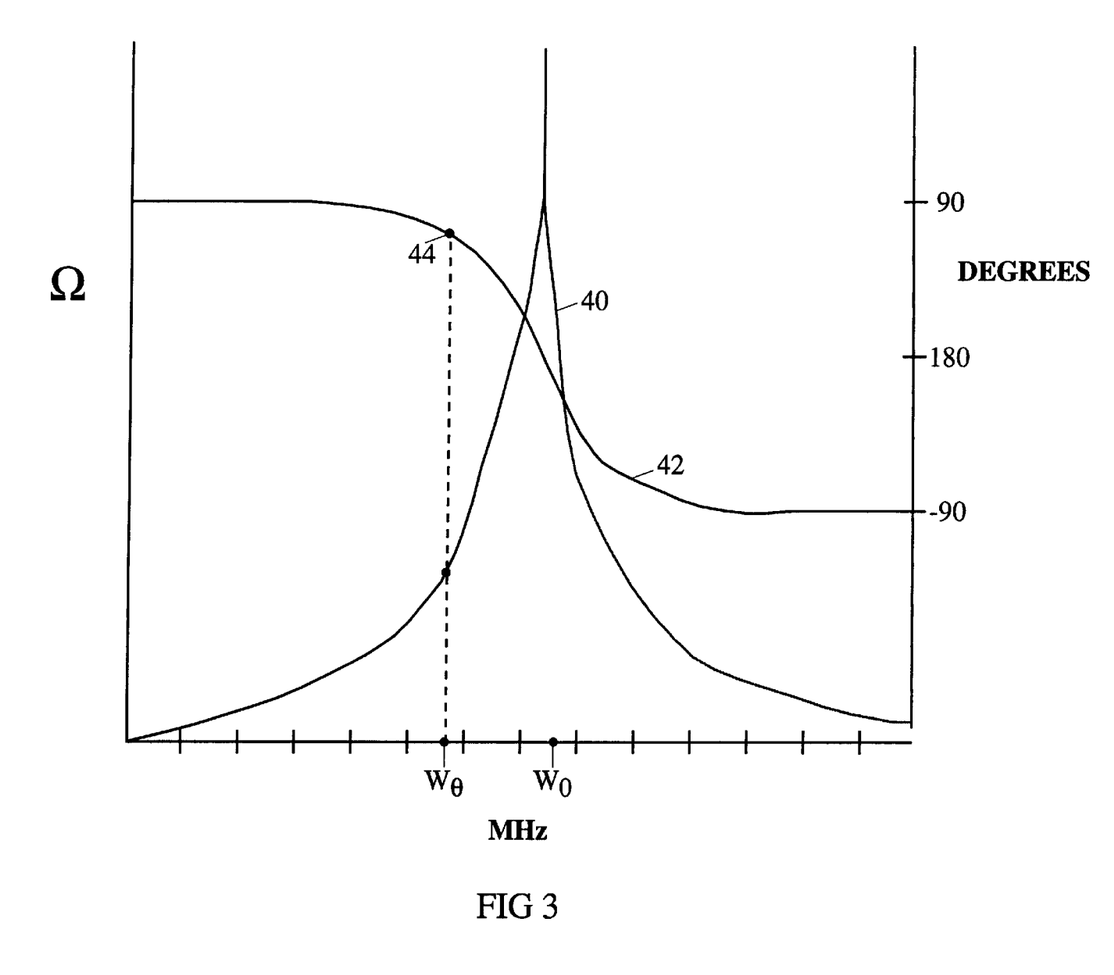
FIG. 3 is a graphical representation of output frequency and corresponding tuning gain factor as a function of control voltage of a typical oscillator.

Some oscillator configurations allow the frequency of the resultant AC signal to change in response to a control signal. Typically an oscillator of this type is referred to as a voltage controlled oscillator (VCO.) FIG. 3 illustrates in a graphical form the output frequency and corresponding tuning gain factor as a function of control voltage of a typical oscillator. A curve 2, as reference to the left vertical axis, represents the frequency response of the oscillator circuit in MegaHertz (MHz) to control signal in Volts (V). A portion of the curve 2 corresponding to a control signal level between 4 and 10 Volts is approximately linear. A straight line 4 is printed over the curve 2 to aid the viewer in the detection of the linear region. If the curve 2 is mathematical differentiated with respect to the control signal, the result is the oscillator sensitivity or gain factor, Kv, typically having units of Hz/V. A curve 6 represents Kv as referenced to the right vertical axis. The curve 6 is typical of standard well-designed oscillators in that Kv has a relatively large region in which its value remains fairly constant.

A VCO may be incorporated into a phase lock loop (PLL) which may precisely tune the VCO to produce a desired output frequency. When a VCO is included in a PLL, Kv is one of the factors which determines the behavior of the loop including the stability of the loop, the resultant phase noise spectrum and the speed at which the loop responds to a change within the loop. If Kv is not linear, the loop characteristics are variable depending on the output frequency resulting in instability and possibly poor phase noise performance at some output frequencies. Therefore, when designing an oscillator for inclusion in a phase look loop, the flatness of Kv is an important factor both in the stability and noise performance of the loop.

With the increased prevalence high frequency consumer communication products, the need for low noise oscillators is also increasing. For example, in the United States, Personal Communication System (PCS) telephones which operate at 1.8 GHz are available to the general public in large quantities. The communication techniques used by these devices operate best when the resulting waveform is produced and received by an oscillator with low phase noise. However, due to the consumer nature of the product, the cost of such products must remain as low as possible in order for the market to enjoy a high level of penetration.

Figure 4:
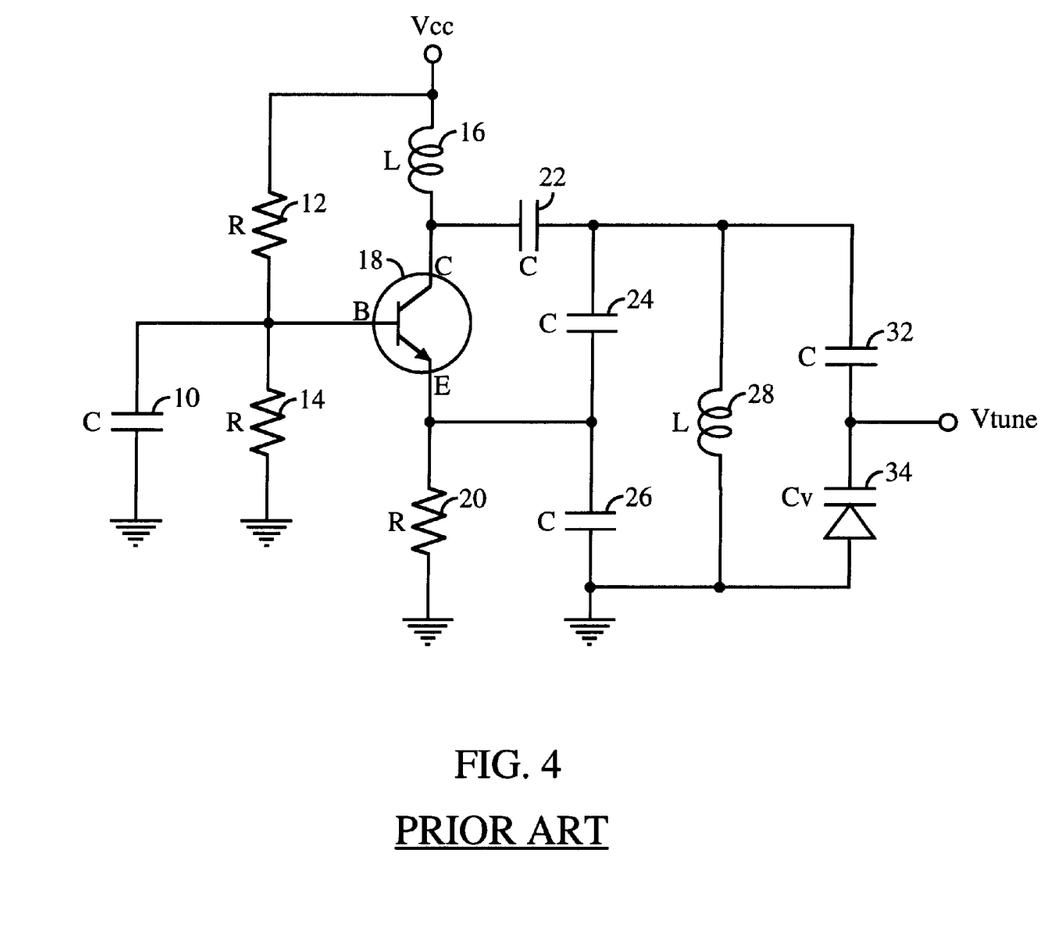
FIG. 4 is a schematic diagram of a typical prior art common base oscillator topology.
Figure 6:
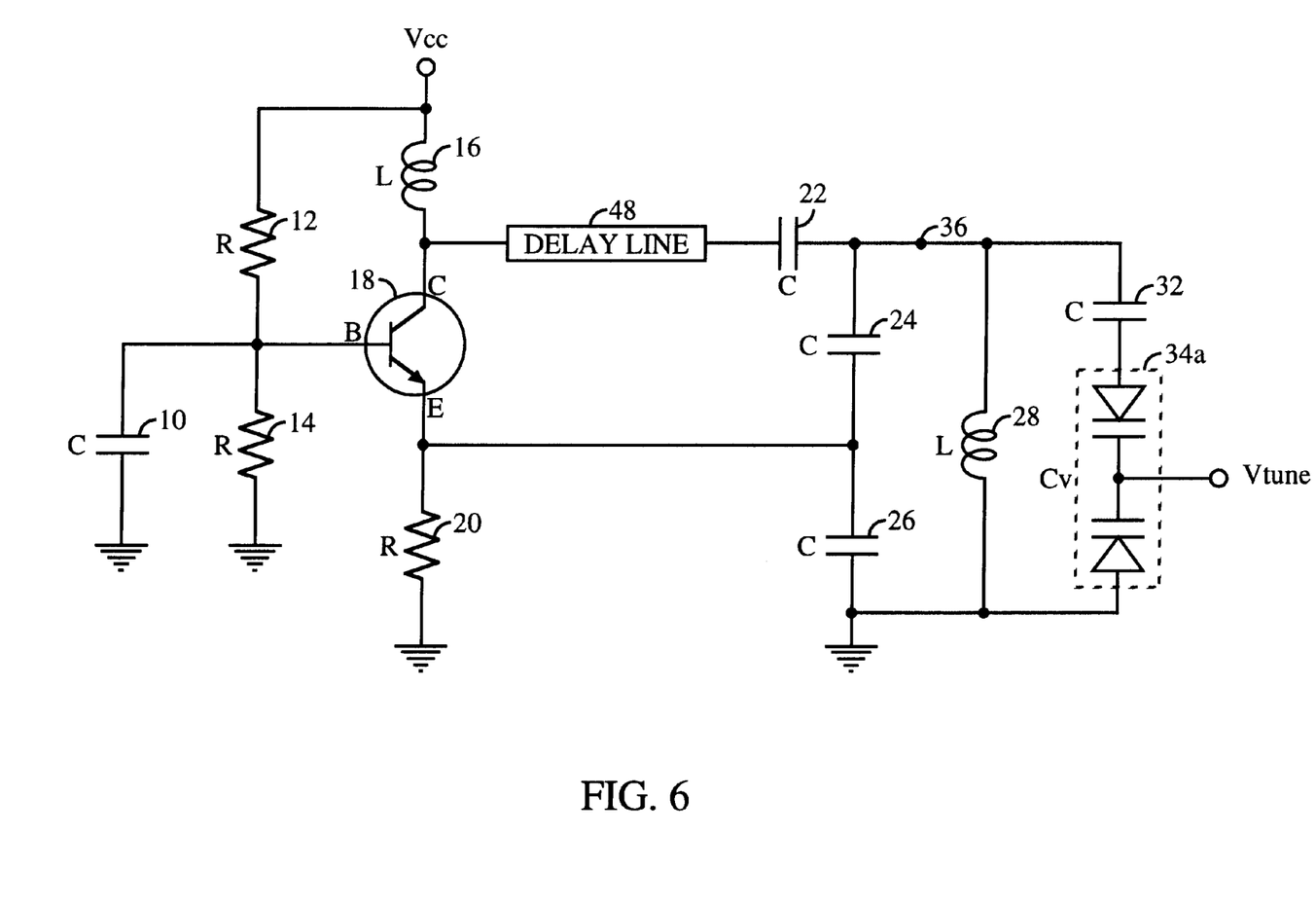
FIG. 6 is a schematic diagram of a common base oscillator topology which incorporates a delay line.
Figure 7:
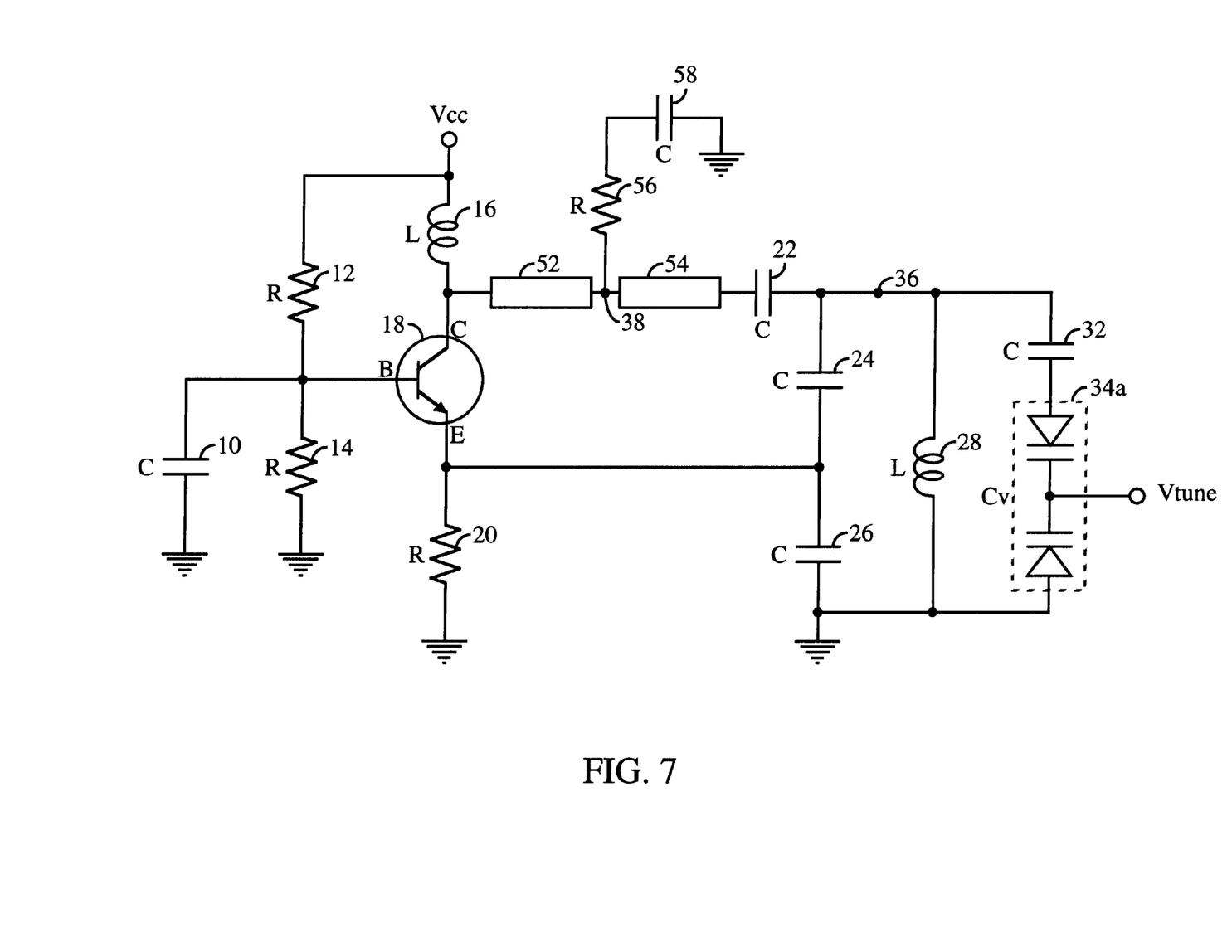
FIG. 7 is a schematic diagram of a common base oscillator topology which incorporates a delay line and a ring mode trap filter.
Figure 8:
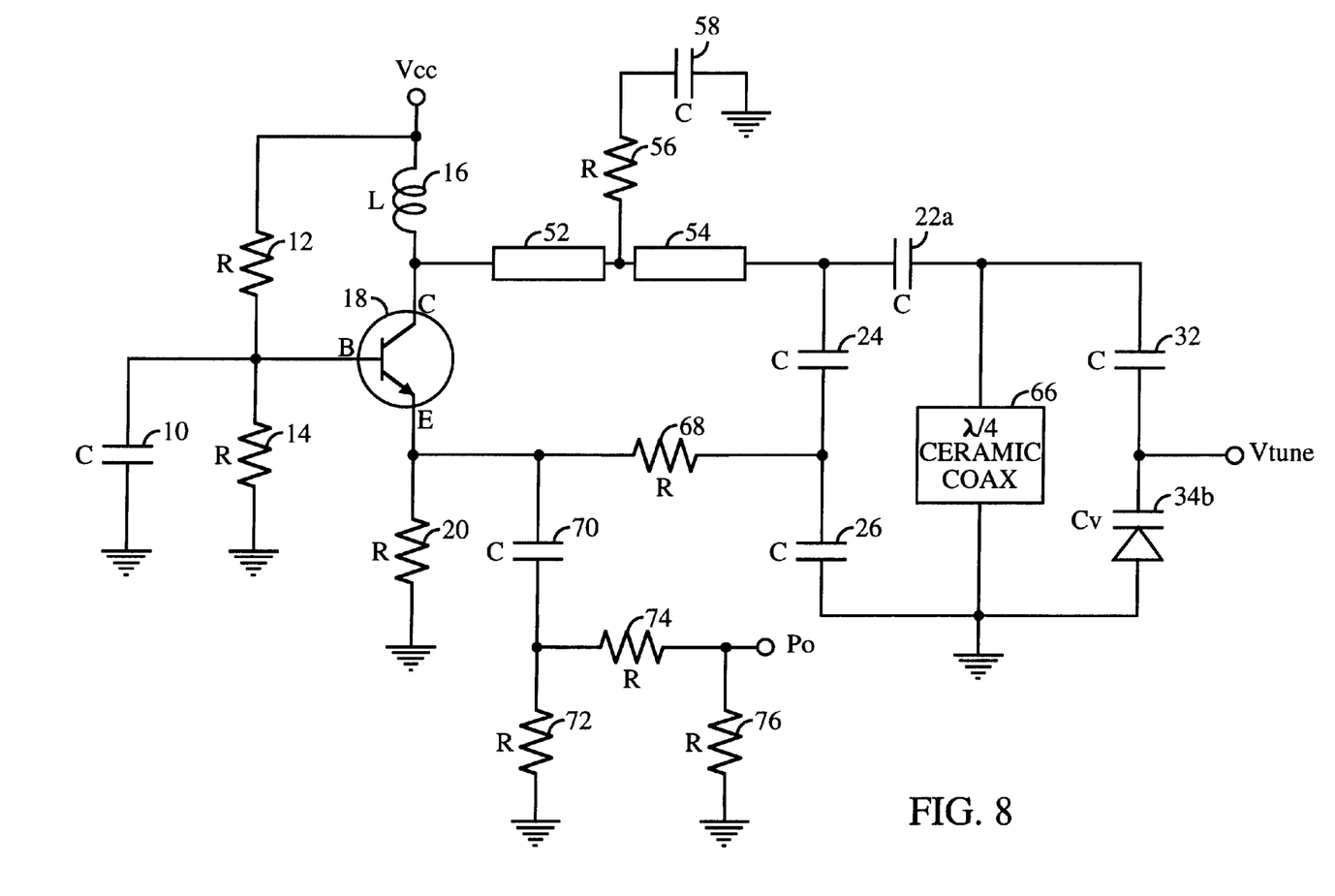
FIG. 8 is a schematic diagram of another common base oscillator topology which incorporates a delay line and a ring mode trap filter.
Figure 9:
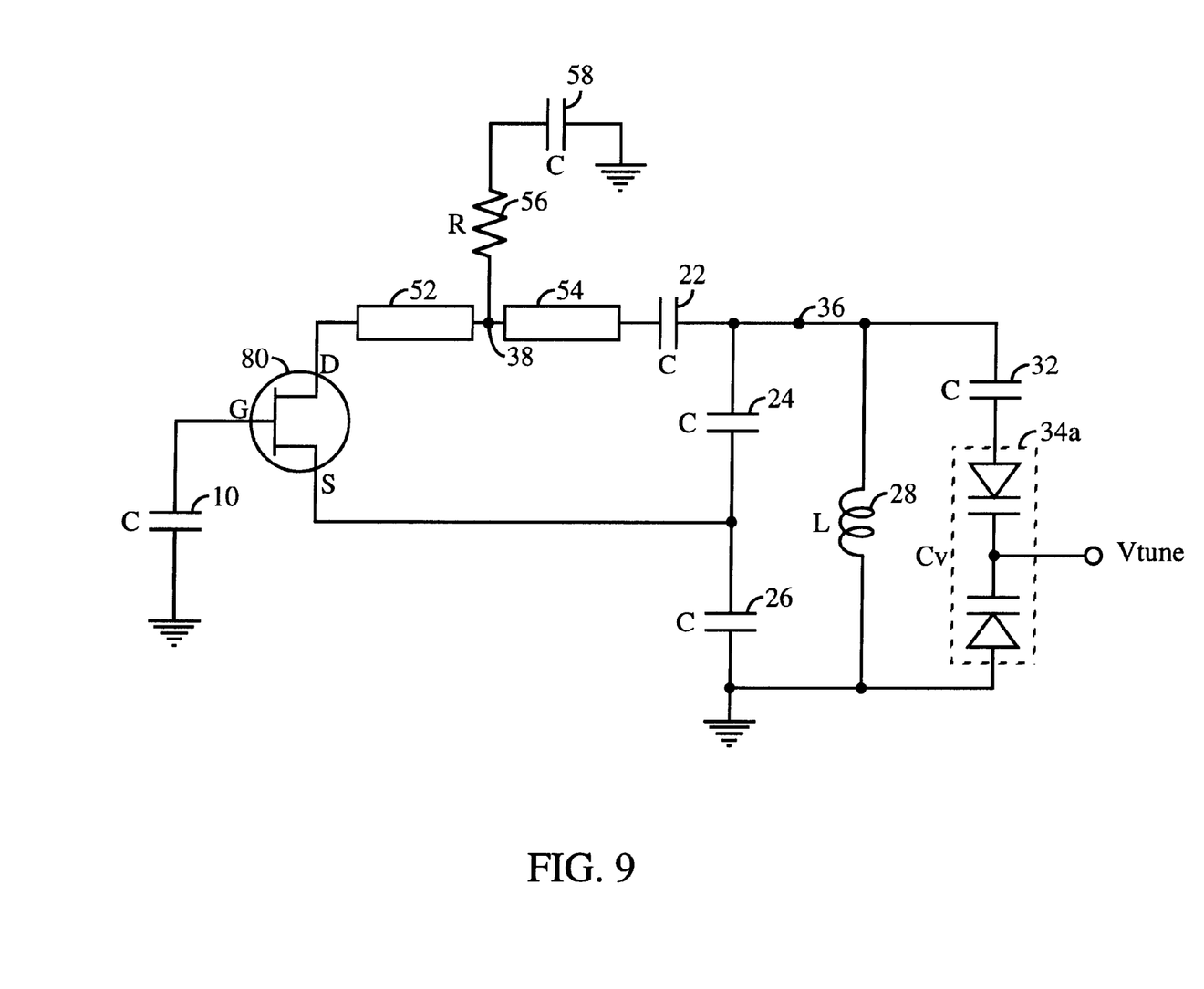
FIG. 9 is a schematic diagram of a common gate oscillator topology which incorporates a delay line and a ring mode trap filter.

FIG. 4 is a schematic diagram of a typical prior art common base oscillator topology. The configuration of FIG. 4 is advantageous because the design minimizes the effects of the capacitance of the base-emitter stray capacitance, Cbe, through a capacitive step-down network. In FIG. 4, an active device 18 is DC biased by the resistors 12, 14 and 20 and an inductor 16. A capacitor 10 acts as a bypass capacitor and provides a short to ground (a common ground) to the base of the active device 18 at the frequency of oscillation. A capacitor 22 acts as a DC blocking capacitor between the tank circuit and the D.C. bias of the active device. The value of the capacitor 22 is chosen to be low impedance at the frequency of oscillation. The tank circuit of the oscillator is comprised of capacitors 24, 26 and 32, an inductor 28 and a varactor 34. The capacitors 24 and 26 act as a step down network. The impedance of the emitter-base junction is effectively increased by 1/n*n where n=(C24+C26)/C24. Therefore, the effect of the base-emitter parasitic capacitance, Cbe, in creating phase noise on the output frequency is reduced. In general, the capacitors 24 and 26 should be chosen as large as possible to reduce the effect of the collector-emitter parasitic capacitance, Cce, as well as the base-emitter parasitic capacitance, Cbe, on the total equivalent capacitance. Also, the capacitors 24 and 26 step down network will help to minimize any resistive loading on the resonant tank from R20. The varactor 34 acts as a variable capacitor. Varactor 34 can comprise back-to-back varactors 34a, as shown in FIGS. 6, 7, and 9, or a single varactor 34b, as shown in FIG. 8. The capacitance of the varactor 34 decreases as the DC voltage applied to it increases. As the capacitance of the varactor 34 changes, the frequency of oscillation of the circuit also changes. Thus, the frequency of oscillation of the oscillator of FIG. 4 is changed according to the voltage applied to it at the point Vtune. The oscillator is termed a voltage controlled oscillator (VCO).

In the ideal case, the oscillation frequency of the circuit shown in FIG. 4 is defined by the equation:

$$w_o = \frac{1}{\sqrt{LC}}$$

where: $\omega$ is the frequency of oscillation;
L is the value of the inductor 28; and
C represents the combined effects of capacitors 24, 26, 32, 34 and the stray capacitances of the active device 18.
Continuous small changes in the frequency produce phase noise. The changes in the oscillation frequency are related to the overall response of the circuit by the following equation:

$$\frac{\Delta w_o}{w_o} = \frac{-1}{2}\left(\frac{\Delta L}{L} + \frac{\Delta C}{C}\right)$$

where: $\Delta \omega_0$ is the change in output frequency;
$\Delta L$ is the change in inductance; and
$\Delta C$ is the change in capacitance.

One main contribution to the close-in phase noise which depends upon the design of the oscillator comes from the time dependent capacitance value, $\Delta C$, which is highly dependent on the junction capacitance of the active device. Note that in addition to the active device junction capacitance, the thermal and junction noise of the varactor 34 or other passive elements which are included in the resonant tank also contribute to the phase noise. However, in a well designed oscillator, the junction capacitance noise dominates the close-in phase noise while the far-out phase noise is dominated by the noise from these other sources.

The topology shown in FIG. 4 works well with bipolar devices which have a large signal transconductance greater than one and phase shift of exactly 180 degrees. The large signal transconductance is defined as follows:

$$Gm = \frac{Ic}{V_{be}} = \text{ABS}(Gm) \angle \theta$$

where: Gm is the large signal transconductance of the active device which is generally a complex number;
Ic is the AC collector current at $\omega_0$;
Vbe is the AC voltage across the base-emitter junction at $\omega_0$;
ABS(Gm) is the magnitude of Gm; and
$\theta$ is the phase of Gm.

In the ideal case for an oscillator, Gm has a phase shift of 180 degrees. Positive feedback occurs when the total feedback path is 360 degrees. In the ideal case, the active device provides 180 degrees of phase shift and the resonant tank provides an additional 180 degrees of phase shift to the total require phase shift of 360 degrees. However in typical active devices, the phase of Gm is a function of frequency and the value of Gm decreases from the ideal 180 degree phase shift at higher frequencies. Therefore, a typical oscillator will operate with the resonant tank providing more than 180 degrees of phase shift to make up for the phase of the Gm being less than 180 degrees.

True $\omega_0$ is defined as the natural frequency of the resonant tank in the absence of the active device. At the true resonant frequency, the phase of the resonant tank is 180 degrees. At all other frequencies, the resonant tank frequency is equal to some other value. Thus, in the configuration shown in FIG. 4, if the active device contributes less than 180 degrees of the phase shift, the oscillator operates at a frequency offset from the true $\omega_0$ of the resonant tank where the resonant tank provided enough additional phase to obtain true positive feedback in the oscillator (e.g., 360 degrees total phase shift).

Figure 5:
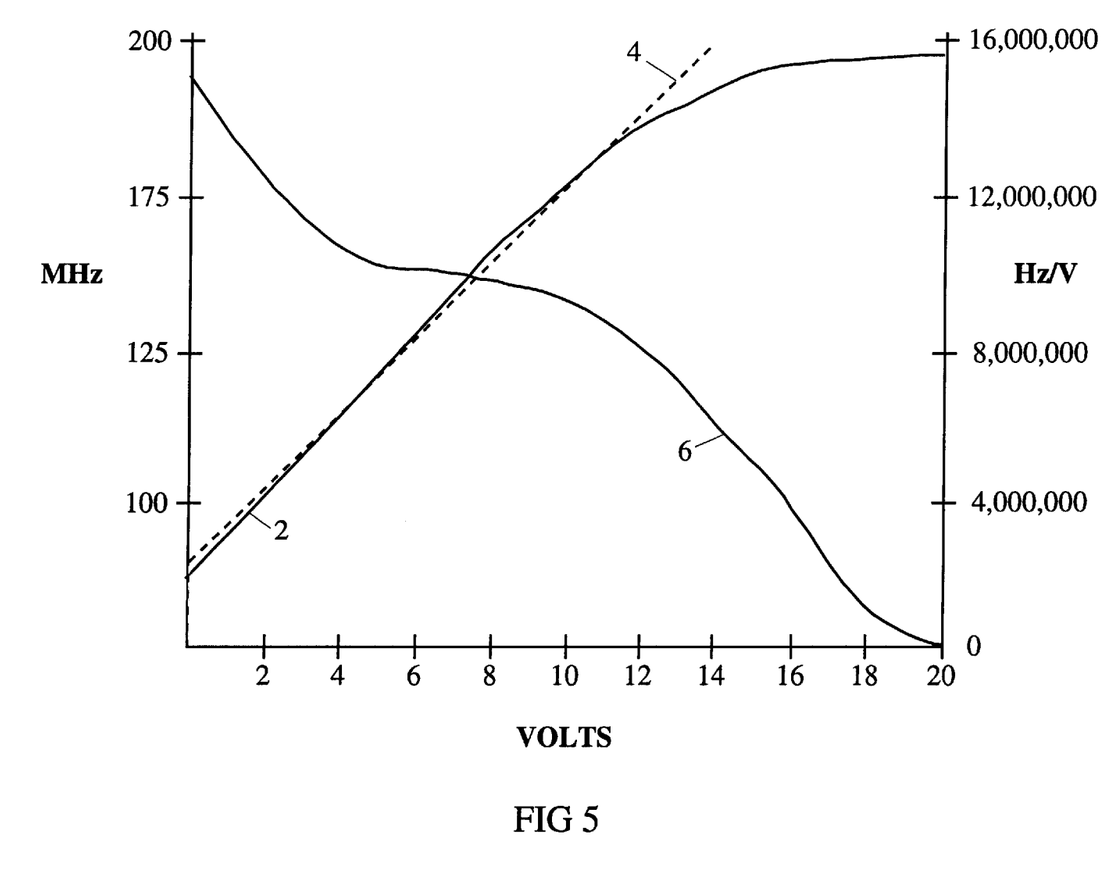
FIG. 5 is a graphical representation of the frequency and phase characteristics of resonant tank circuit.

FIG. 5 is a graphical representation of the frequency and phase characteristics of a parallel resonant tank circuit which can be used to illustrate the adverse effect of oscillating offset from true $\omega_0$. A curve 40 is referenced to the left vertical axis and represents the impedance of a typical resonant tank as a function of frequency in MegaHertz (MHz). A curve 42 is referred to the right vertical axis and represents the phase characteristic of the typical resonant tank as a function of frequency in MHz. When a resonant tank oscillates at the true $\omega_0$, the corresponding phase characteristic of the resonant tank are very linear. Due to the linear nature of the phase, the tuning gain of the oscillator, Kv, is more likely to be linear. Also, due to the linear nature of the phase, minor noise disturbances do not cause large non-linear phase noise. In comparison, if the resonant circuit oscillates below the true $\omega_0$ at $\omega_\theta$, the corresponding phase characteristic is more likely to be non-linear.

For example, assume that the resonant circuit is forced to oscillate at $\omega_\theta$ as shown on FIG. 5. The corresponding phase at $\omega_\theta$ as shown at point 44 is extremely non-linear. As a result, the linearity of the tuning gain of the oscillator may be adversely effected, i.e. Kvco becomes more non-linear. As the tuning gain, Kv, of the oscillator increases, the phase noise due to the varactor and the control voltage applied to the varactor may also increase. Also, due to the non-linear nature of the phase, the same small disturbance which would cause a negligible phase distortion at $\omega_\theta$ creates a non-linear phase error which in turn causes large amounts of phase noise at $\omega_\theta$. Many other factors can also contribute to nonlinear tuning gain curves such as the characteristics of the varactor and the inductor. By using the present invention, the negative effects of the characteristics of the inductor and varactor on tuning gain linearity are reduced.

One practical way to compensate for a device having a transconductance of less than 180 degrees at the desired frequency of oscillation is to decrease the value of capacitor 22 of FIG. 4. Although decreasing the value of the capacitor 22 may help offset a small shifts in $\theta$, the method has several deficiencies. For example, the small value of capacitor 22 corresponds to a large impedance at the oscillation frequency and, therefore, significantly reduces the gain in the feedback network as the collector voltage is now divided across the capacitors 22, 24 and 26. To eliminate the undesirable side effects due to decreasing the value of the capacitor 22, the present invention provides an improved means and method of compensation for the non-ideal phase shift of the active device.

Thus, it will be appreciated that there is a need in the technology for a means and method of providing a low noise, low cost oscillator. The present invention provides such an oscillator.

SUMMARY OF THE INVENTION

The present invention is a novel and improved low noise oscillator which may operate over a large range of frequencies including high frequencies. Although the present invention may be used with any type of active device, the present invention lends itself to use with a relatively low frequency bipolar transistor in order to reduce cost and improve the availability of parts. Such low frequency bipolar transistors have good phase noise characteristics. The present invention may also be used to increase the frequency range of oscillators whether or not coupled with a low phase noise requirement. Most generally, the present invention provides a stable oscillator suitable in a large variety of applications. The present invention may comprise any type of active device.

The present invention generally comprises a common base or gate oscillator design. In order for the oscillator circuit to oscillate as close as possible to the natural resonant frequency of the tank circuit, a delay is added to the circuit to account any difference in the phase shift of the active device away from the ideal 180 degree phase shift. For example, if the phase shift of the device is X degrees, the inserted delay should approximate 180-X degrees of phase shift at the frequency of interest.

Use of the delay may introduce a second mode of oscillation called a ring mode. In ring mode, the impedance at the resonant tank is low, while in the desired mode, the impedance of the resonant tank is high. In another embodiment of the present invention, in order to squelch the ring mode, the delay line is divided into two portions such that the total delay remains the same. The first portion of the delay line couples the collector to an intermediate node and the second portion couples the intermediate node to the resonant tank circuit. The length of the second portion of the delay line is one quarter wavelength long. Thus, at the intermediate node the impedance of the resonant tank circuit is transformed 180 degrees around the Smith chart. Thus, when the oscillator is operating in ring mode, the impedance looking into the resonant tank circuit from the intermediate node is high while, in the desired mode, the impedance looking into the resonant tank circuit from the intermediate node is low.

Another embodiment of the present invention adds a relatively low impedance ring mode trap filter at an intermediate node. In ring mode, the relatively low impedance of the ring mode trap filter is in parallel with the transformed high impedance of the resonant tank and the impedance of the ring mode trip filter determines the characteristic of the node. The characteristics of the ring mode trap filter are chosen such as to produce a stable point for the active device and, thus, no oscillation occurs at the ring mode frequency.

In the desired mode, the relatively low impedance of the ring mode trap filter is in parallel with the transformed low impedance of the resonant tank and therefore the impedance of the transformed resonant tank determines the characteristics of the node. Thus, the ring mode trap filter has little effect on the desired mode of oscillation but a large effect on the undesired ring mode. Also, the first portion of the delay line may be used to optimize the impedance presented to the collector.

DETAILED DESCRIPTION OF THE PREFERRED EMBODIMENT

The present invention is a novel and improved oscillator. The oscillator uses a unique topology which promotes low noise operation, linear tuning gain, high tuning frequency range and the use of a low frequency active device. The following description begins with analysis of a prior art oscillator configuration comprising a bipolar transistor having a collector, emitter, and base. The general principles of the prior art as well as the present invention are generically applicable to any active device including field effect transistors (FETs). In general a collector is analogous to any port of an active device through which primary charge carriers flow such as a drain of a FET. Likewise, in general an emitter is any port of an active device through which primary charge carriers are supplied such as a source of a FET and a base is any port of an active device which controls the current or voltage between the other ports of the device such as a gate of a FET.

The present invention teaches the insertion of a delay line between the collector and the tank to compensate for the non-ideal phase shift of the active device. FIG. 6 is a schematic diagram of a common base oscillator topology which incorporates a delay line. In FIG. 6, a delay line 48 has been inserted between the collector of the active device 18 and the tank circuit (as coupled through a DC blocking capacitor 22.) The length of the delay line is determined by the additional phase shift needed and the frequency of oscillation. For example, if the desired frequency of operation is 1.8 GHz and the phase shift of the active device 18 at that frequency is reduced to 60 degrees, the delay line 48 should provide about 120 degrees of phase shift. A phase shift of 120 degrees at 1.8 GHz corresponds to about 185 picoseconds. The delay line can be implemented with a printed circuit trace that is one third of a wavelength long. The delay line could also be implemented using passive lumped elements or additional active elements.

Note that without the delay line 48, an active device which has only 60 degrees of phase shift at the desire frequency of oscillation would not be a viable choice for the oscillator. Thus, the inclusion of the delay line allows a lower frequency part to be used where it would not otherwise be possible. Lower frequency parts have several advantages. For example, lower frequency parts are typically more readily available, cheaper and more immune to part variations. Also, lower frequency bipolar devices exhibit better phase noise characteristics than higher frequency FET parts. The ability to use lower frequency parts is one advantage of the present invention. Also note that because the resonant tank is operating at its true $\omega_0$, the tuning gain of the device is fairly constant and the device has an increased immunity to phase noise from a number of sources.

The oscillator shown in FIG. 6 is low noise and exhibits relatively flat tuning gain across the frequency of interest. However in some cases, the oscillator in FIG. 6 may have two modes of oscillation: a desired mode and a ring mode. The frequency at which the oscillator operates in ring mode is not the same frequency at which it operates in the desired mode. For example, an oscillator which operates at 1.8 GHz in the desired mode may operate at 2 GHz in ring mode. Ring mode is a product of the introduction of the delay line 48. The introduction of the delay line provides a second feedback path for the oscillator. The second feedback path is comprised of the delay line 48, which can be modeled as a printed inductor, and the capacitors 24 and 26.

In ring mode, the impedance at the node 36 is very low while in the desired mode, the impedance at the node 36 is high. Because the impedance at the node 36 in ring mode is low, the effect of the inductor 28 and the varactor 34a on the frequency of oscillation is quite low. Therefore, once the oscillator has begun oscillating in ring mode, the control voltage at Vtune has little or no effect on the frequency of oscillation.

The adverse of effects are best explained by way of example. Suppose that a VCO that has a ring mode and a desired mode is designed into a phase lock loop which operates from 1.75 GHz to 1.85 GHz. In ring mode, the oscillator operates at 2.1 GHz. Suppose that power is applied to the VCO. The VCO may initially begin to operate in either the desired mode or the ring mode. If the VCO begins to oscillate in ring mode at 2.1 GHz, when the loop is programmed the control voltage Vtune falls to its minimum value in an attempt to lower the frequency of oscillation. However, as noted above, in ring mode, the impedance at the node 36 is low and the VCO does not respond to changes in the varactor capacitance. Therefore, the VCO is 'stuck' in ring mode. The user must cycle power to the VCO in an attempt to achieve operation in the desired mode. Also note, that even if the loop initially operates in the desired mode, the oscillator may abruptly change to ring mode at any time and become stuck in ring mode until power is cycled.

Another embodiment of the present invention adds a trap filter to the delay circuitry to eliminate ring mode oscillation. In order to implement the ring mode trap filter, the designer takes advantage of the fact that the impedance of the node 36 is low in ring mode yet high in the desired mode. Through the use of a trap filter, the advantages obtained by the introduction of the delay line are retained while the ring mode oscillation is eliminated.

FIG. 7 is a schematic diagram of a common base oscillator topology which incorporates a delay line and a ring mode trap filter. The delay line 48 of FIG. 6 has been replaced with delay lines 52 and 54 which define an intermediate node 38. The delay line 54 is chosen to be a quarter wavelength at the desired oscillation frequency. Typically, the ring mode oscillation frequency and the desired mode oscillation frequency are relatively close together in frequency and the length of 54 need only approximate a quarter wavelength at either the desired frequency or the ring mode frequency.

As is well known in the field, a quarter wavelength transmission line transforms an impedance 180 degrees around the Smith chart. Thus, the impedance looking into low impedance point through a quarter wavelength transmission line is high and the impedance looking into a high impedance point through a quarter wavelength transmission line is low.

Thus, in the configuration shown in FIG. 7, when the oscillator is operating in ring mode, the impedance looking into the tank from the intermediate node 38 is high while in the desired mode the impedance looking into the tank from the intermediate node 38 is low.

The ring mode trap filter is connected to the intermediate node 38. The impedance of the ring mode trap filter is relatively low. In ring mode, the relatively low impedance of the ring mode trap filter is in parallel with the transformed high impedance of the ring mode resonant tank and therefore the impedance of the ring mode trip filter determines the characteristic of the intermediate node 38. The characteristics of the ring mode trap filter are chosen such as not to produce an unstable point and, thus, no oscillation occurs at the former ring mode frequency.

In FIG. 7, the ring mode trap filter is comprised of a resistor 56 and a capacitor 58. In general any structure that offers a low impedance at the desired RF frequency may be used. Alternatively, the ring mode trap filter may be comprised of distributed or lumped components or even other active devices.

In the desired mode, the relatively low impedance of the trap filter is in parallel with the transformed much lower impedance of the resonant tank and the impedance of the transformed resonant tank determines the characteristics of the node 38. Thus, the ring mode trap filter has little effect on the desired mode of oscillation.

In addition to providing a portion of the desired delay, the first portion of the delay line may be used to optimize the impedance presented to the collector in terms of noise figure or maximum power transferred or a combination of these and other characteristics. Note that the characteristic impedance of the delay lines 52 and 54 need not be the same. The characteristic impedance of the delay line 52 should be chosen such that the impedance of the ring trap filter is transformed to a larger impedance than the impedance of the resonant tank at resonance at node 36 so as not to significantly degrade the Q of the resonant tank or add more thermal noise to the tank. For example, the characteristic impedance, Zo, of the delay line 52 is chosen as greater than the resistive value of 56 but less than the impedance of the tank Q resonance. In this way the resistive loading of the ring mode trap filter on the resonant tank is minimized. When the delay line 54 is equal to a quarter wavelength, the loading on the collector is defined by:

$$Z_c = \frac{Z_o^2}{Z_F} > Z_t$$

where: Zc is the impedence of the transformed ring mode trap filter at the resonant tank (node 36);

Zo is the characteristic impedance of the delay line 52;

Zf is the impedance of the ring mode trap filter at the frequency of interest; and Zt is the impedance of the resonant tank at the resonant frequency.

FIG. 8 is a schematic diagram of another common base oscillator topology which incorporates a delay line and a ring mode trap filter. In FIG. 8, the inductor 28 has been replaced by a ceramic coaxial resonator 66 which provides very high Q inductance at high frequencies. Also, a tap circuit has been added to couple some output energy without excessively effecting the operation of the oscillator. The tap circuit is comprised of resistors 72, 74, and 76 and a capacitor 70. The resistor 68 is included in the circuit to provide an RF feedback mechanism that has the effect of lowering the 1/f noise of an RF oscillator. As capacitor 70 is made larger, more energy is coupled out of the oscillator and the effect on the oscillator is increased. Therefore, the capacitor 70 allows the designer to make a tradeoff between output power from the oscillator and the effect on the oscillator. In practice, the capacitor 70 lightly loads the emitter node. The resistors 72, 74 and 76 provide a resistive pad to isolate the loading of any network connected at the output, Po.

Using the configuration shown in FIG. 8, an oscillator was constructed using a relatively low frequency bipolar transistor from NEC Corporation having part number NEC 85639. The phase of the large signal gain, Gm, of the NEC 85639 is approximately equal to 45–50 degrees at 1.8 GHz and, therefore, without the teachings of the present invention, this part would not be a wise choice for a high frequency oscillator. The constructed circuit provided 100 MHz of tuning range centered about 1.8 GHz. Without the addition of the ring mode trap filter, a ring mode oscillation was seen to occur at a frequency of 2.01 GHz. The length of the delay line 52 was approximately 550 mils (1 mil=0.001 inch) and the length of delay line 54 was approximately 925 mils on a substrate with permitivity $\epsilon_r=3.9$. The characteristic impedance of both the delay lines 52 and 54 was approximately 100 Ohms. The resister 56 has a value of about 30 Ohms. The phase noise of the output was measured as −125 dBc/Hz at 100 KHz and −150 dBc/Hz at 1 MHz offset from the carrier.

There are many variations to the general topology shown in FIGS. 6, 7, and 8. For example, in some cases, a phase shift of about 90 degrees is sufficient to compensate for the q of the active device. In such cases, the delay line 52 of FIGS. 7 and 8 may be eliminated. If a trap filter is not necessary, the topology is the same as the general case shown in FIG. 6. If the oscillator exhibits a ring mode, the trap filter may be attached directly to the collector or attached through a transforming lumped element or disturbed network. Also, it is not necessary that the length of delay line 54 of FIGS. 7 and 8 equal approximately one quarter wavelength in some cases. If a delay equivalent to a phase shift of less than 90 degrees is required in order to cause oscillation at true $w_0$, the length of these delay lines may be reduced. A delay line that is less than one quarter wavelength still transforms the low impedance of ring mode to a higher impedance so long as the effect on the resonant tank is taken into consideration. Therefore, even if the total delay is equal to or less than a 90 degree phase shift, the topology of FIGS. 7 or 8 may be used with the trap filter separated from both the collector and the resonant tank by some delay length.

Also note that the biasing topology in FIG. 7 may be changed within the scope of the present invention. Note that the node 38 is a low impedance point and that the delay line 52 is a good conductor of D.C. power. Therefore, it may be advantageous to use the node 38 to inject the D.C. power to bias the active device 18. For example, the inductor 16 of FIG. 7 may be connected between the D.C. voltage input, Vcc, and the node 38.

FIG. 9 is a schematic diagram of a common gate oscillator topology which incorporates a delay line and a ring mode trap filter and a FET 80. In FIG. 9, the biasing network for the FET 80 has been omitted from the diagram to facilitate ease of comparison with the other figures herein. The FET 80 should be biased at a low noise point as is easily done by one skilled in the art. Note that aside from the substitution of the FET 80 for the active device 18 in FIG. 7, no significant changes are required to use a FET in accordance with the present invention.

As note throughout the text, the present invention provides a myriad of advantages and improves over prior art oscillators. An oscillator constructed according to the present invention may operated at any one of a large range of frequencies including very high frequencies. Although the present invention may be used with any type of active device, the present invention lends itself to use with a relatively low frequency bipolar transistor. Such low frequency bipolar transistors typically have good phase noise characteristics, are inexpensive and exhibit fairly low process variations. Thus, the present invention may be used to in designs where very low phase noise is required. An oscillator according to the present invention may provide a large frequency tuning range around a nominal center frequency. An oscillator according to the present invention exhibits increased linearity of the tuning gain, Kv. Most generally, the present invention provides a stable oscillator suitable in a large variety of applications.

The previous description of the preferred embodiments is provided to enable any person skilled in the art to make or use the present invention. The various modifications to these embodiments will be readily apparent to those skilled in the art, and the generic principles defined herein may be applied to other embodiments without the use of inventive faculty. Thus, the present invention is not intended to be limited to the embodiments shown herein but is to be accorded the widest scope consistent with the principles and novel features disclosed herein.

What is claimed is:

1. An oscillator comprising:
    a biased active device having an active port through which charge carriers flow;
    a tank circuit;
    a delay element which couples said tank circuit to said active port of said biased active device; and
    a trap filter coupled to said delay element.

2. The oscillator of claim 1 wherein said biased active device is a field effect transistor and said active port is a drain port.

3. The oscillator claim 1 wherein said biased active device is a bipolar transistor and said active port is a collector port.

4. The oscillator of claim 1 wherein said tank circuit comprises lumped elements.

5. The oscillator of claim 1 wherein said tank circuit comprises distributed elements.

6. The oscillator of claim 1 wherein said tank circuit comprises a ceramic resonator.

7. The oscillator of claim 1 wherein said trap filter has a low resistive value at a frequency of interest.

8. The oscillator of claim 1 wherein said trap filter comprises lumped elements.

9. The oscillator of claim 1 wherein said trap filter comprises distributed elements.

10. The oscillator of claim 1 wherein said trap filter comprises an active device.

11. The oscillator of claim 1 further comprising one or more varactor diode coupled to said tank circuit such that a desired frequency of oscillation may be changed according to a voltage applied to said varactor diode.

12. The oscillator of claim 1 wherein said biased active device has a transconductance gain phase of $\theta$ degrees and where said delay element introduces a delay approximately equivalent to 180 minus $\theta$ degrees at a desired frequency of oscillation.

13. The oscillator of claim 1 further comprising a lumped element matching circuit disposed between said active port of said biased active device and said trap filter.

14. The oscillator of claim 1 wherein said trap filter has a larger impedance than a transformed impedance of said tank circuit as measured at said trap filter at a desired frequency of oscillation.

15. The oscillator of claim 14 wherein said trap filter has a smaller impedance than a transformed impedance of said tank circuit as measured at said trap filter at a frequency at which oscillation is not desired.

16. The oscillator of claim 1 wherein said trap filter is separated from said tank circuit by approximately one quarter wavelength.

17. The oscillator of claim 16 wherein said delay element is comprised of:
    a first printed strip line portion disposed between said trap filter and said tank circuit, said first printed strip line portion providing said approximately one quarter wavelength of separation; and
    a second printed strip line portion disposed between said active port and said trap filter.

18. The oscillator of claim 17 wherein said first printed strip line portion has a first characteristic impedance and said second printed strip line portion has a second characteristic impedance.

19. The oscillator of claim 17 wherein said trap filter has a larger impedance than a transformed impedance of said tank circuit as measured at said trap filter at a desired frequency of oscillation.

20. The oscillator of claim 19 wherein said second printed portion transforms an impedance of said trap filter and said transformed impedance of said tank circuit to provide a stable operating point at frequencies other than said desired frequency of oscillation.

21. An oscillator comprising:
    an active device;
    a delay means coupled to an active port of said active device;
    a resonance means coupled to said active port through said delay means; and
    a trap means coupled to an intermediate point on said delay means;
    wherein said delay means introduces a phase shift necessary to allow said active device to oscillate near a true natural frequency of said resonance means and wherein said trap means squelches a ring mode oscillation at an undesired frequency.

22. An oscillator comprising:
    an active device in a common base topology;
    a first delay line having a first end and a second end, said first end coupled to a collector of said active device;
    a ring mode trap filter coupled to said second end of said first delay line;
    a second delay line having a first end and a second end, said first end coupled to said second end of said first delay line, said second delay line being approximately one quarter wavelength at a desired oscillation frequency; and
    a tank circuit coupled to said second end of said second delay line;
    wherein said ring mode trap filter presents a low impedance at a ring mode frequency, wherein said ring mode frequency is a frequency at which said tank circuit presents a low impedance and at which said active device would be unstable but for said ring mode trap filter.

23. An oscillator comprising:
    means for providing a gain greater than one at a phase shift of less than 180 degrees;
    transforming means coupled to said means for providing said gain;

means for providing a quarter wavelength delay coupled to said transforming means such that said transforming means is disposed between said means for providing said gain and said means for providing said quarter wavelength delay;

filter means disposed between a node between said transforming means and said means for providing said quarter wavelength delay and a ground potential; and resonance means coupled to said means for providing said quarter wavelength delay such that said means for providing said quarter wavelength delay is disposed between said transforming means and said resonance means.

* * * * *